United States Patent [19]

Tsujide et al.

[11] Patent Number: 5,532,610

[45] Date of Patent: Jul. 2, 1996

[54] APPARATUS FOR TESTING SEMICONDCTOR WAFER

[75] Inventors: Tohru Tsujide; Toshiyasu Hishii; Kazuo Nakaizumi, all of Tokyo, Japan

[73] Assignee: NEC Corporation, Tokyo, Japan

[21] Appl. No.: 295,030

[22] Filed: Aug. 25, 1994

[30] Foreign Application Priority Data

Aug. 25, 1993 [JP] Japan .................................. 5-232386
Aug. 9, 1994 [JP] Japan .................................. 6-206133

[51] Int. Cl.$^6$ .......................... G01R 1/073; G01R 31/02
[52] U.S. Cl. ..................... 324/757; 324/754; 324/760
[58] Field of Search ............................. 324/754, 158.1, 324/757, 760

[56] References Cited

U.S. PATENT DOCUMENTS

| | | | |
|---|---|---|---|
| 4,585,991 | 4/1986 | Reid et al. ............................... | 324/757 |
| 4,833,402 | 5/1989 | Boegh-Petersen ....................... | 324/754 |
| 5,014,161 | 5/1991 | Lee et al. ................................. | 361/709 |
| 5,123,850 | 6/1992 | Elder et al. ............................. | 324/158.1 |
| 5,140,405 | 8/1992 | King et al. ............................... | 439/91 |
| 5,177,439 | 1/1993 | Liu et al. ................................. | 324/754 |
| 5,206,585 | 4/1993 | Chang et al. ............................ | 324/754 |
| 5,219,765 | 6/1993 | Yoshida et al. ......................... | 324/754 |
| 5,367,253 | 11/1994 | Wood et al. ............................. | 324/158.1 |

*Primary Examiner*—Ernest F. Karlsen
*Attorney, Agent, or Firm*—Popham, Haik, Schnobrich & Kaufman, Ltd.

[57] ABSTRACT

The apparatus for collectively burning-in or testing a plurality of semiconductor chips disposed on a wafer without dicing the chips into individuals, the apparatus including a testing substrate, an active circuit disposed on the testing substrate for activating chips disposed on the wafer to be tested, a plurality of pads disposed on the testing substrate and positioned so that the pads are disposed in alignment with bonding pads of the chips disposed on the wafer when the testing substrate is overlaid on the wafer, and an anisotropic conductive layer disposed on the pads.

12 Claims, 3 Drawing Sheets

APPARATUS FOR TESTING SEMICONDCTOR WAFER

BACKGROUND OF THE INVENTION

1. Field of the Invention

The invention relates to an apparatus for testing or burning-in semiconductor chips, and more particularly to such an apparatus for testing or burning-in semiconductor chips with the chips being disposed on a common wafer, that is to say, without chips being diced into individual chips.

2. Description of the Related Art

A semiconductor device has been conventionally fabricated in the following steps of: forming a plurality of chips on a silicon wafer by means of photolithography technique; separating chips into individuals by so-called "dicing" step; wire-bonding; sealing each chip with resin; and packaging each of chips. Then, an electrical load is applied to the thus packaged chips for a short period of time under high temperature atmosphere, for instance, at 125 degrees centigrade. The appliance of an electrical load to chips makes it possible to initially find inferior products. This step is called a "burn-in" step, and is carried out in manufacturing steps of almost all semiconductor devices.

As mentioned above, thermal load and electrical load are given to each of chips in the burn-in step. In addition to this, a measurement of electrical properties of chips is also carried out in the burn-in step in these days. This step is called a "test and burn-in" step. The purpose of the test and burn-in step is to find and hence remove inferior chips at an initial stage with high accuracy and in a short period of time. In a step prior to or after a burn-in step, or in a final step, a tester is often used for removing inferior devices and/or controlling qualities of devices. Such a tester for testing devices are used after each of chips has been packaged as mentioned so far.

On the other hand, function tests for chips have been carried out with a prober and a tester before each chips is packaged, that is, while each chips is still disposed on a wafer. However, it is quite difficult to carry out such function tests at high speed.

In a conventional burn-in process, a burn-in step is carried out after each of chips has been packaged as a final product, as aforementioned. This means that steps of wire-bonding and/or sealing with resin are in vain for chips which have been found to be inferior by a burn-in step, causing the increase of costs.

In addition, a method such as MCM in which naked chips not sealed with resin are directly positioned on a substrate has been widely used, and thus it is desired to improve a burn-in process applicable to chips mounted on a wafer by the above mentioned method. It is in particular desired to establish a burn-in process in which chips are to be burnt-in before a plurality of chips formed on a wafer are diced into individual chips, because such a process makes it possible to carry out a burn-in step at earliest among manufacturing steps to thereby reduce the manufacturing costs.

As aforementioned, the tests for devices have conventionally been carried out after a chip was packaged as a final product. This results in a problem that chips which have been found inferior in the tests cannot be repaired with an appropriate means such as a redundancy circuit.

In other words, with respect to high integration, it is necessary for a memory having large capacity such as 64 MDRAM to be positioned in parallel for testing, because it takes tens of hours to test such a memory. Thus, it is in turn necessary to install additional driver circuits and/or increase capacity of such driver circuits, causing a manufacturing cost of a tester to be increased.

With respect to the increased operation speed of a device, it is preferable for a measurement system including a tester to be positioned as closely as possible to a device. However, a conventional tester has a limit in positioning closely to a device, and in addition such positioning causes a manufacturing cost to be high.

As aforementioned, simple function tests have been carried out with a prober with chips being disposed on a wafer or without dicing chips into individuals. However, this method is accompanied by a problem that a high-speed testing is impossible due to a large parasitic capacity of a probe card.

Thus, it is desired to establish a method in which it is not necessary to remodel a tester into an expensive one, and by which it is possible to carry out high-speed function tests for a plurality of parallel disposed chips with such chips being disposed on a wafer or without dicing chips into individuals.

SUMMARY OF THE INVENTION

In view of the foregoing problem, it is an object of the present invention to provide an apparatus capable of burning-in and testing a plurality of semiconductor chips formed on a wafer with such chips being disposed on a wafer or without dicing the chips into individual chips.

In one aspect, the invention provides an apparatus for testing or burning-in a plurality of semiconductor chips disposed on a wafer, the apparatus including a testing substrate, an active circuit disposed on the testing substrate for activating chips disposed on a wafer to be tested, a plurality of pads disposed on the testing substrate and positioned so that the pads are disposed in alignment with bonding pads of the chips disposed on the wafer when the testing substrate is engaged to the wafer, and an anisotropic conductive layer disposed on the pads.

In another aspect, the invention provides an apparatus for testing or burning-in a plurality of semiconductor chips disposed on a wafer, the apparatus including a testing substrate, an active circuit disposed on the testing substrate for activating chips disposed on a wafer to be tested, a plurality of pads disposed on the testing substrate and positioned so that the pads are disposed in alignment with bonding pads of the chips disposed on the wafer when the testing substrate is engaged to the wafer, an anisotropic conductive layer disposed on the pads, and a device electrically connected to the testing substrate for controlling the testing substrate.

In a preferred embodiment, the device for controlling the testing substrate is electrically connected to the testing substrate through a flexible print substrate.

In another preferred embodiment, the device for testing the wafer includes a circuit for rapidly testing a plurality of chips formed on the wafer at the same time and a memory for storing the results of the test.

In still another preferred embodiment, the testing substrate is made of material having a thermal expansion coefficient not more than $13\times10^{-6}$ per degree.

In yet another preferred embodiment, the material is silicon.

In still yet another preferred embodiment, the active circuit includes a circuit for supplying an electrical current to the chips disposed on the wafer, a circuit for controlling an electrical current to be supplied to the chips disposed on the wafer, and a circuit for selecting a chip among the chips disposed on the wafer.

In further preferred embodiment, the testing substrate has a glass substrate secured to a bottom surface thereof.

In further another preferred embodiment, the testing substrate is provided with a plurality of apertures serving as alignment marks for aligning the wafer with the testing substrate.

In further preferred embodiment, each of the apertures has a quadrangular pyramid shaped (111) plane formed by anisotropic-etching a silicon wafer having a (100) plane.

In further preferred embodiment, the active circuit receives an external signal to thereby activate a chip identified with the external signal among chips disposed on the wafer.

In further preferred embodiment, the apparatus further includes a device for compressively securing the wafer to the testing substrate.

In further preferred embodiment, the apparatus further includes a device for providing thermal stress with the wafer.

In further preferred embodiment, the device for providing thermal stress with the wafer is a heater or a cooler.

In further preferred embodiment, the apparatus further includes a bath for containing therein the apparatus to maintain the apparatus at a constant temperature.

The advantages obtained by the aforementioned present invention will be described hereinbelow.

In the present invention, the testing substrate is made of the material having the thermal expansion coefficient not more than $13 \times 10^{-6}$ per degree, for instance, a silicon wafer to thereby make it possible to burn-in or test chips without dicing chips to be tested into individual chips. The use of a silicon wafer as a testing substrate makes it possible to set various burn-in conditions or testing conditions such as supplying voltage to semiconductor chips formed on a wafer and intended to be tested or burnt-in, and taking out an output from a specific chip. In the present invention, the testing substrate is electrically connected to a wafer to be tested through an anisotropic conductive layer, and hence there needs no complicated connecting means such as a probe needle. The connection between the testing substrate and the wafer to be tested can be strengthened by using means for compressively securing them to each other. In addition, since the testing substrate may have a glass substrate secured thereto to thereby enhance mechanical strength thereof, the testing substrate is durable enough against ordinary use. Even if the wafer is curved, such a curvature can be corrected by vacuum-chucking a wafer to be tested on a flat stage, making it possible to avoid misregistration of the wafer with a pattern of the testing substrate. By forming one or more aperture with the wafer of the testing substrate, it is possible to observe patterns of the wafer to be tested from above the testing substrate. Thus, the apertures can serve as alignment marks when the testing substrate is engaged to the wafer to be tested. When a silicon wafer having a (100) plane is to be used as a testing substrate, it is possible to form apertures each having a quadrangular pyramid shaped (111) plane formed by means of anisotropic etching.

The above and other objects and advantageous features of the present invention will be made apparent from the following description made with reference to the accompanying drawings, in which like reference characters designate the same of similar parts throughout the drawings.

DESCRIPTION OF THE PREFERRED EMBODIMENTS

Preferred embodiments in accordance with the invention will be explained hereinbelow with reference to drawings.

EMBODIMENT 1

Figure 1:
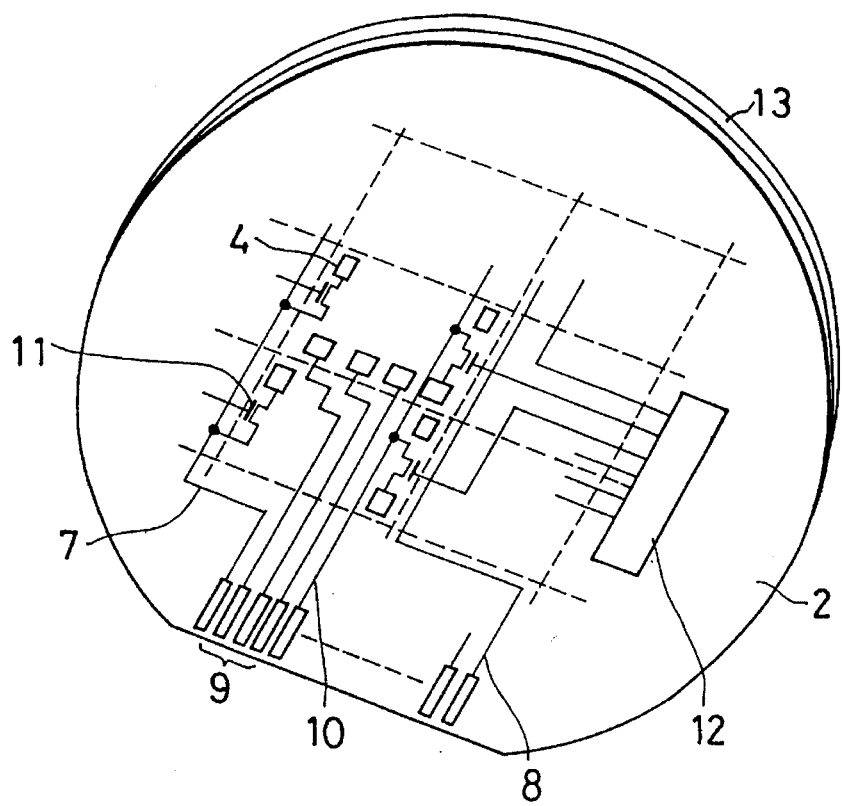
FIG. 1 is a perspective view of the apparatus in accordance with an embodiment of the present invention.
Figure 2:
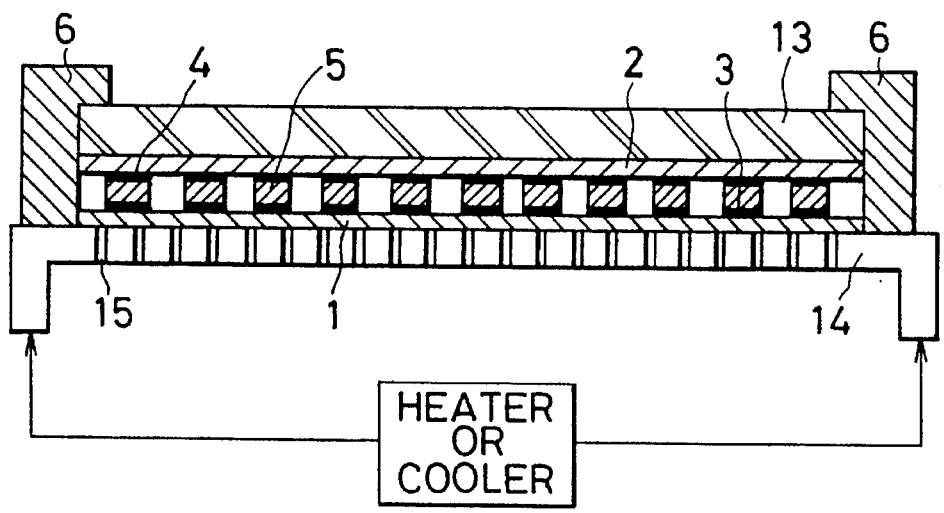
FIG. 2 is a cross-sectional view of the testing substrate engaged to a wafer to be tested.
Figure 3:
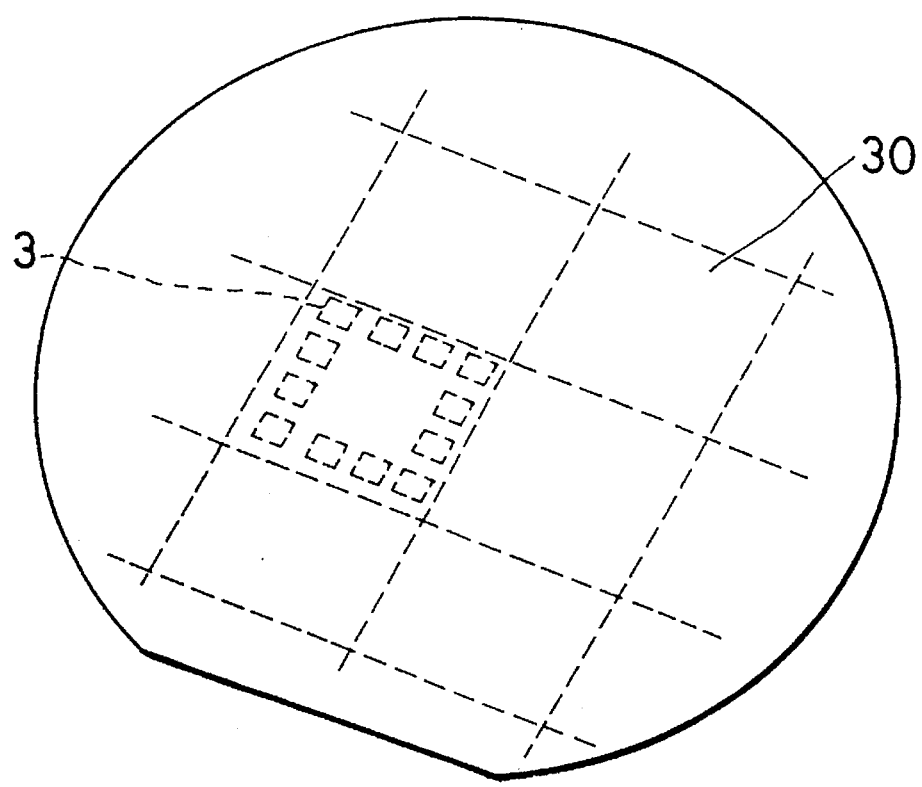
FIG. 3 is a perspective view illustrating a wafer to be tested.

FIG. 1 is a perspective view illustrating an apparatus in accordance with the invention, FIG. 2 is a cross-sectional view illustrating a testing substrate is secured on a wafer to be tested, and FIG. 3 is a perspective view illustrating a wafer to be tested or burnt-in. In FIG. 3, on a wafer 1 to be tested or burnt-in is formed a plurality of semiconductor chips 30 through semiconductor fabricating steps including a photolithography step. In FIG. 1, a wafer 2 serving as a burn-in substrate or a testing substrate is made of the same material as that of the wafer 1 to be tested, in this embodiment, silicon, and is supported at a bottom surface thereof by a glass substrate 13 secured thereto by, for instance, an electrostatic bonding process, to thereby enhance mechanical strength of the testing substrate. On a front surface of the testing substrate 2 are formed pads 4 which have anisotropic conductive layers 5 provided thereon and are positioned so that the pads 4 are disposed in alignment with bonding pads 3 disposed on each of the semiconductor chips 30 formed on the wafer 1 when the testing substrate 2 is overlaid on the wafer 1. On the testing substrate 2, from the pads 4 extend lead wires such as a line 7 to be connected to a power supply, a ground line 8, an I/O line 9 and a chip selecting line 10, each working in accordance with a function of the pad 4 from which the line extends. In the power supply line 7 is disposed a circuit 11 for interrupting the supply of power in order not to flow an excessive current therethrough even if chips to be burnt-in are in short-circuit. In the illustrated embodiment, the supply of power is interrupted by controlling a gate voltage applied to a transistor to thereby render the transistor non-conductive. It should be noted that the flow of an excessive current can be prevented to some degree also by connecting a diffused resistor in series with the power supply line 7. The chip selecting line 10 extending from each chip disposed on the wafer 2 is connected to a chip selecting decoder 12 disposed on the wafer or the testing substrate 2, and thus can receive a signal from outside through the decoder 12 to thereby activate a chip identified with the signal to produce an output from the chip.

In use of the apparatus in accordance with the invention, as illustrated in FIG. 2, the wafer 1 to be tested is placed on a stage 14 having a plurality of holes 15. Then, the testing substrate 2 illustrated in FIG. 1 is overlaid on the wafer 1 so that the glass substrate 13 of the testing substrate 2 faces upward. The curvature of the wafer 1 to be tested can be corrected by vacuum-chucking the wafer 1 to the substrate 2. A fixture 6 compressively fixes the wafer 2 at a periphery thereof, so that the pads 3 disposed on the wafer 1 to be tested are in electrical connection with the pads 4 disposed on the testing substrate 2 through the anisotropic conductive layers 5 provided on the pads 4. Then, a specific chip disposed on the wafer 1 to be tested is activated by an external signal transmitted through the testing substrate 2, to thereby obtain a desired output.

In addition, it is preferable to heat or cool the wafer to be tested through the stage 14 with appropriated devices 31 such as a heater and a cooler for the purpose of providing thermal stress with the wafer to be tested. Alternatively, the whole apparatus may be contained in a bath, which maintains the apparatus at a constant temperature, for providing thermal stress with the wafer to be tested.

EMBODIMENT 2

Figure 4:
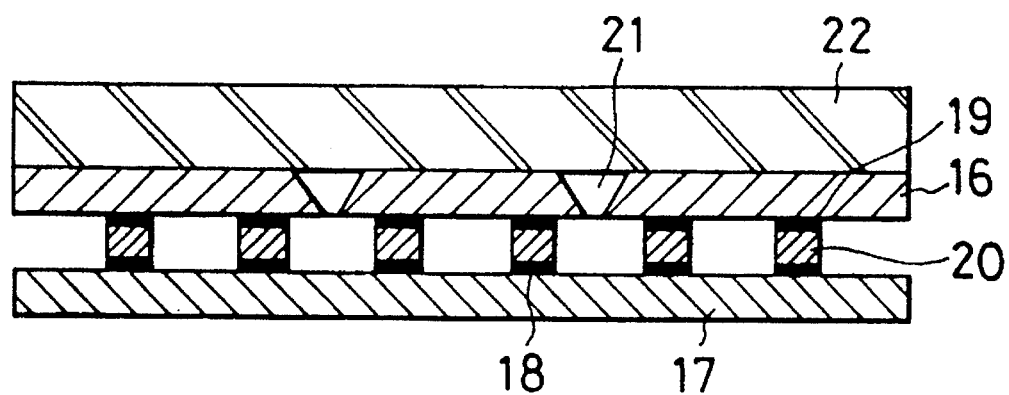
FIG. 4 is a cross-sectional view of another testing substrate engaged to a wafer to be tested.

FIG. 4 illustrates a second embodiment in accordance with the invention. A testing apparatus 16 is made of a silicon wafer having a (100) plane, and initially has two square shaped through-holes formed using a silicon nitride ($Si_3N_4$) layer as a mask. By carrying out an anisotropic-etching process, the square shaped through-holes develop to apertures 21 having a (111) plane which is quadrangular pyramid shaped. On a front surface of the testing substrate 16 are formed pads 19 which have anisotropic conductive layers 20 thereon and are positioned so that the pads 16 are disposed in alignment with bonding pads 18 disposed on each chip formed on a wafer 17 to be tested when the testing substrate 16 is overlaid on the wafer 17. The pads 18 are in electrical connection with the pads 19 through the anisotropic conductive layers 20. In this embodiment, the apertures 21 can serve as a alignment mark to thereby make it easy to register the testing substrate 16 with the wafer 17 to be tested. In FIG. 2, parts corresponding to those of FIG. 1 have been provided with the same reference numerals.

EMBODIMENT 3

Figure 5:
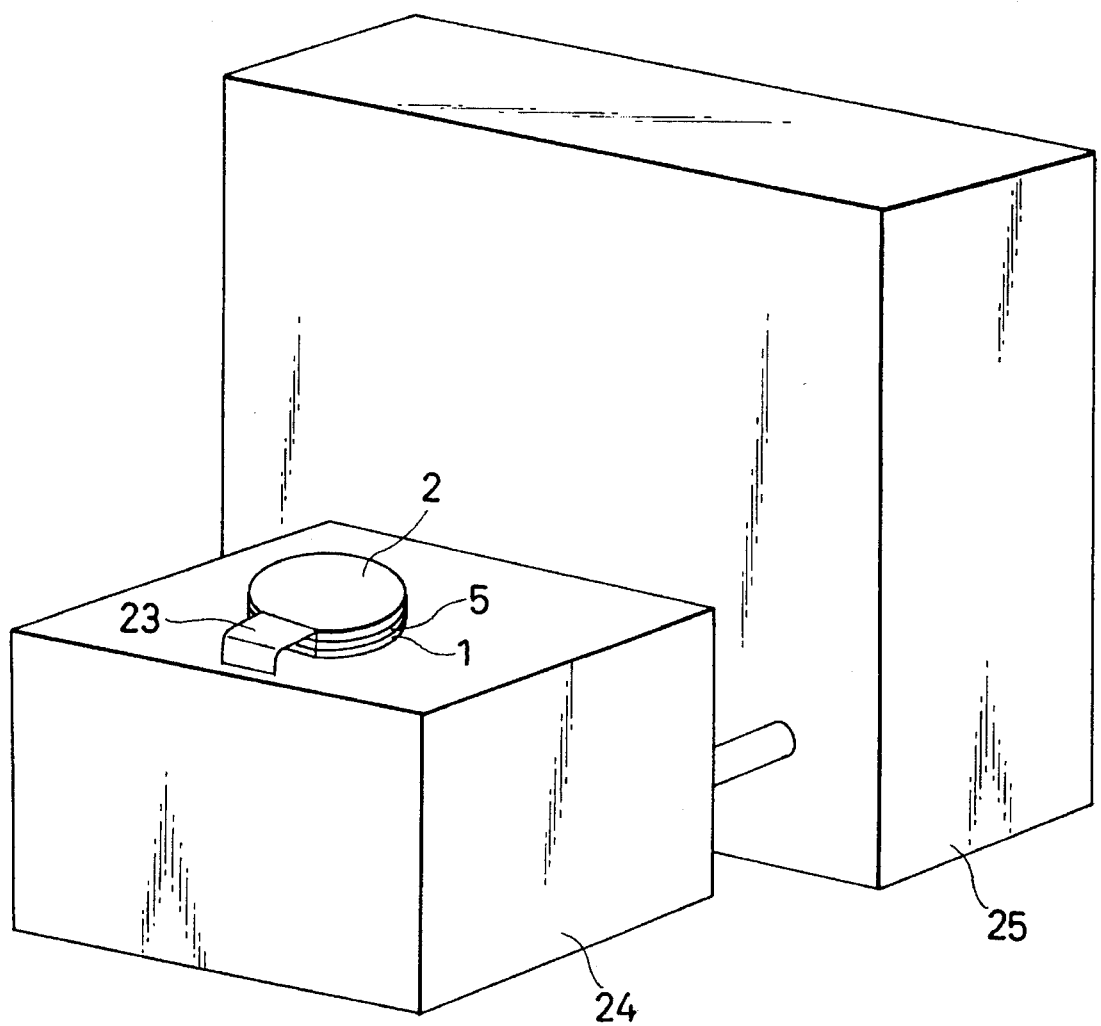
FIG. 5 is a perspective view of the apparatus in accordance with another embodiment of the present invention.

FIG. 5 illustrates a third embodiment in accordance with the present invention. The wafer 1 to be tested, the testing substrate 2 and the anisotropic conductive layers 5 have the same structure as those shown in the first embodiment. On the testing substrate 2 are integrated an active circuit such as that shown in the first embodiment, a circuit for rapidly testing a plurality of chips formed on a wafer at the same time, and a memory for storing the results of the test.

The input and output (I/O) line 9 extending from the testing substrate 2 is electrically connected to a tester head 24 through a flexible print substrate 23. The tester head 24 is further connected to a tester 25. Thus, the operation of the testing substrate 2 is controlled by the tester 25.

Since circuits for testing such as the aforementioned are not incorporated in the tester 25, but incorporated in the testing substrate 2, it is possible to make the manufacturing cost the tester to be lower.

As aforementioned, according to the present invention, it is possible to burn-in for testing a plurality of chips disposed on a wafer without dicing chips into individual chip.

In accordance with the invention, circuits for testing the wafer are integrated not in the tester but on the testing substrate, whereas a conventional tester had to include therein testing circuits which were required to have high performance due to the highly increased functions of a device. Thus, the invention makes it possible to rapidly test chips with a cheaper tester at the same time, in addition, with the chips being disposed on a wafer or without dicing the chips into individuals.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An apparatus for testing or burning-in a plurality of semiconductor chips disposed on a wafer, said apparatus comprising:

a testing substrate;

an active circuit disposed on said testing substrate for activating chips disposed on a wafer to be tested;

a plurality of pads disposed on said testing substrate and positioned so that said pads are disposed in alignment with bonding pads of said chips disposed on said wafer when said testing substrate is engaged to said wafer;

an anisotropic conductive layer disposed on said pads; and means electrically connected to said testing substrate for testing said wafer, and including a circuit integrated on said testing substrate for rapidly testing a plurality of chips formed on said wafer at the same time and a memory integrated on said testing substrate for storing the results of the test.

2. An apparatus in accordance with claim 1, further comprising a flexible print substrate, wherein said means for testing said wafer further includes a tester head electrically connected to said testing substrate through said flexible print substrate.

3. An apparatus in accordance with claim, 1, wherein said testing substrate is made of material having a thermal expansion coefficient not more than $13 \times 10^{-6}$ per degree.

4. An apparatus in accordance with claim 3, wherein said material is silicon.

5. An apparatus in accordance with claim 1, wherein said active circuit includes a circuit for supplying an electrical load to said chips disposed on said wafer, a circuit for controlling an electrical load to be supplied to said chips disposed on said wafer, and a circuit for selecting a chip among said chips disposed on said wafer.

6. An apparatus in accordance with claim 1, further comprising a glass substrate, wherein said testing substrate has said glass substrate secured to a bottom surface thereof.

7. An apparatus in accordance with claim 1, wherein said testing substrate is provided with a plurality of apertures serving as alignment marks for aligning said wafer with said testing substrate.

8. An apparatus in accordance with claim 7, wherein each of said apertures has a quadrangular pyramid shaped (111) plane formed by anisotropic-etching a silicon wafer having a (100) plane.

9. An apparatus in accordance with claim 1, wherein said active circuit includes means for receiving an external signal to thereby activate a chip identified with said external signal among chips disposed on said wafer.

10. An apparatus in accordance with claim 1 further comprising means for compressively securing said wafer to said testing substrate.

11. An apparatus in accordance with claim 1 further comprising means for providing thermal stress with said wafer.

12. An apparatus in accordance with claim 1 further comprising a bath for containing therein said apparatus to maintain said apparatus at a constant temperature.

* * * * *